US 7,483,289 B2

(12) United States Patent
Jain

(10) Patent No.: US 7,483,289 B2
(45) Date of Patent: Jan. 27, 2009

(54) SYNCHRONOUS SRAM CAPABLE OF FASTER READ-MODIFY-WRITE OPERATION

(75) Inventor: Seema Jain, Bhopal (IN)

(73) Assignee: STMicroelectronics PVT. Ltd., Uttar Pradesh (IN)

( * ) Notice: Subject to any disclaimer, the term of this patent is extended or adjusted under 35 U.S.C. 154(b) by 172 days.

(21) Appl. No.: 11/195,337

(22) Filed: Aug. 2, 2005

(65) Prior Publication Data
US 2006/0034132 A1   Feb. 16, 2006

(30) Foreign Application Priority Data
Aug. 2, 2004  (IN)  .................. 1431/DEL/2004

(51) Int. Cl.
*G11C 11/00*   (2006.01)
(52) U.S. Cl. .............. 365/154; 365/189.04; 365/189.05
(58) Field of Classification Search ............ 365/189.04, 365/154, 189.05; 711/155
See application file for complete search history.

(56) References Cited

U.S. PATENT DOCUMENTS 5,369,622 A * 11/1994 McLaury .................... 365/233
6,073,219 A *  6/2000 Ohno ......................... 711/155

* cited by examiner

*Primary Examiner*—VanThu Nguyen
*Assistant Examiner*—Alexander Sofocleous

(57) ABSTRACT

An improved synchronous SRAM capable of faster read-modify-write cycle time using separate input and output terminals. It describes the circuitry for performing a RMW operation in a memory module at high frequency in a nanometer technology. A byte write enable bus is incorporated into the device so as to provide the flexibility of modification and correction at selective columns, keeping rest of the columns unaltered. The termination of read operation and the triggering of write operation is done by the activation of same signal. Also described is the provision for tuning the circuitry for triggering write operation depending on the time taken by the controller to modify and revise the read-out data.

8 Claims, 6 Drawing Sheets

105 : memory cell
106 : sense amplifier
102, 111 : decoders
101, 103, 112, 113 : latches Signal Description
18, 19 : bl_replica, blb_replica
20 : dummy bitline
21 : ck_dummyrow
22 : reset
23 : bl_senclk_replica
24, 25 : bl<0:1>, blb<0:1>
26 : bl_senclk
27, 28 : bl<14:15>, blb<14:15>

3 : Dummy discharge memcell
4 : Dummy column
6 : Replica memcell column
7, 8, 9, 14 : Dummy memcell
10, 11, 12 : Input-Output(IO) Block
13 : Replica IO Block
16 : Invertor

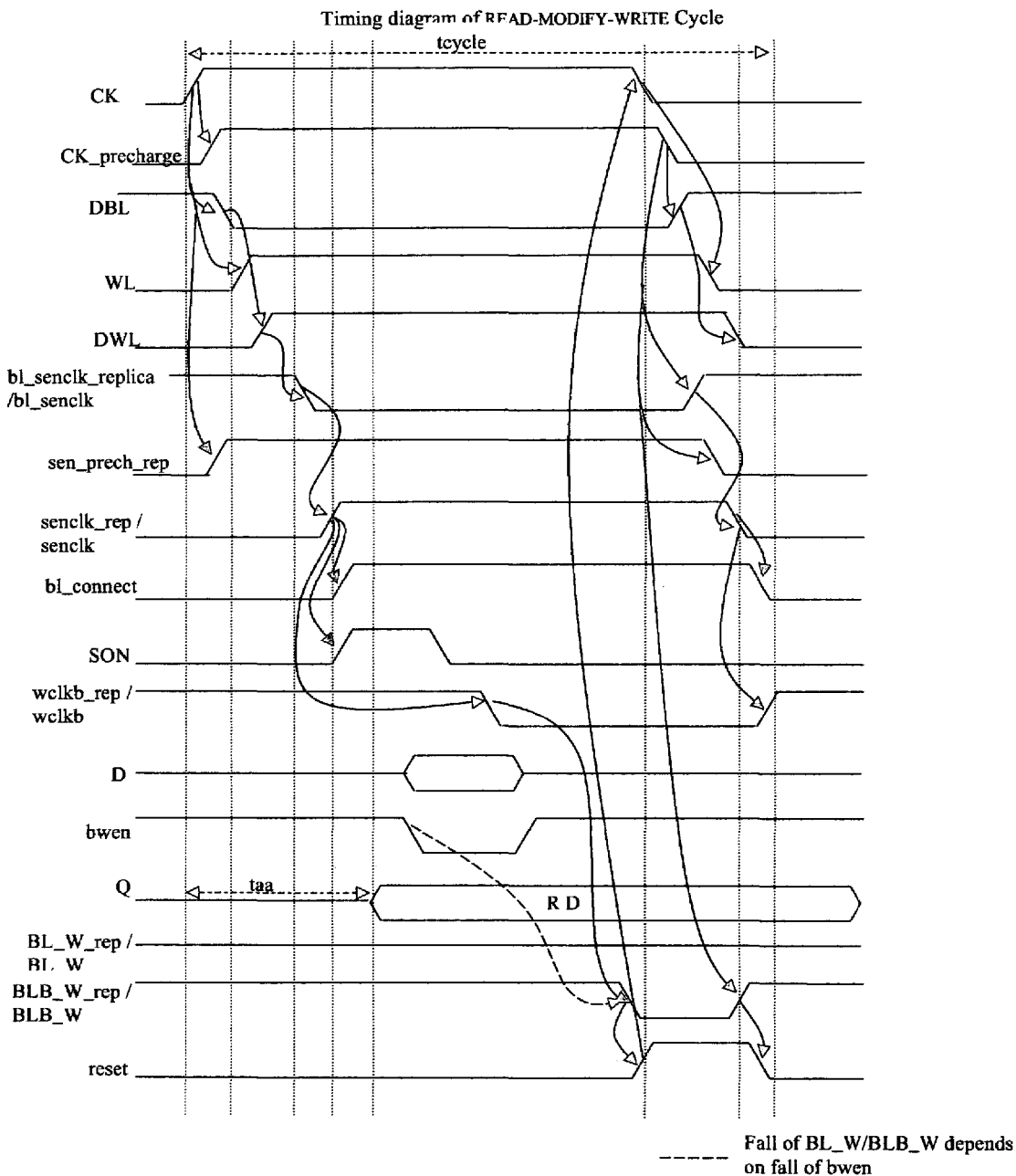

SYNCHRONOUS SRAM CAPABLE OF FASTER READ-MODIFY-WRITE OPERATION

TECHNICAL FIELD OF THE INVENTION

The present invention pertains to the field of semiconductor memory device, and more particularly to an improved synchronous SRAM capable of faster read-modify-write operation.

BACKGROUND OF THE INVENTION

The demand for 'high performance' in SRAM cache memories is becoming significantly important. Moreover with the advancement in technology, it becomes extremely important to meet high-speed requirements in complex circuits involving a large number of operations. In order to design high-performance system, read-modify-write (RMW) operation at higher clock frequency is desired. In RMW operation, the data is read out from the memory; a graphics controller or a CPU modifies it for subsequent rewriting operation of the modified and corrected data.

FIG. 1 presents the prior art in a conventional synchronous semiconductor memory to perform high speed RMW operation. The objective is attained in six clock cycles as highlighted below:

i.) Clock No. 1: Address signals are latched in flip-flop 101 at setup time of first clock cycle.

ii.) Clock No. 2: These address signals are decoded in a decoding circuit 102 and are inputted to a latch circuit 103 which latches the signal at the active edge of the second clock cycle.

iii.) Clock No. 3: When read command is issued from the read command circuit 112, the read control circuit 114 directs the read amplifier 107 to amplify the data outputted by the sensing amplifier 106 which in turn is selected by the column selecting signals YSWs. The data amplified by the read amplifier 107 is outputted to input/output pin DQ at the set-up timing of a third clock CLK3 outputted from the read control circuit 114. Simultaneously, for stopping a write command a signal is inputted to the write control circuit 115.

iv.) Clock No. 4: The read-data RD1 is supplied to the controller for modification and correction at the occurrence of the active edge of this clock cycle.

v.) Clock No. 5: No operation is performed at the occurrence of the active edge of this clock cycle to set the data bus in high impedance state. This high impedance state of the data bus is set to avoid a collision between the memory-driving signal and an external controller-driving signal.

vi.) Clock No. 6: during this clock cycle, rewriting in the memory after modification and correction is done.

Hence the conventional synchronous semiconductor memory performs RMW operation in six clock cycles.

The architecture described has separate read amplifier 107 and write amplifier 109 and selectively switches the read data bus obtained from read amplifier and write data bus from write amplifier depending on whether the clock is to be utilized for read operation or write operation.

The architecture and circuitry proposed in this document aims at overcoming the above disadvantage of consuming large number of clock cycles by designing a high-speed RMW operation. In the proposed architecture, four operations are performed in a single clock cycle, namely 1. Reading from a specified location
2. Data Updation
3. Writing at same location and
4. Precharge operation

SUMMARY OF THE INVENTION

To address the above-discussed deficiencies of the prior art, it is an object of the present invention to provide a memory module, which performs a RMW function at high frequency.

It is a further object of the present invention to provide a memory module performing RMW operation at selective columns.

It is still further object of the present invention to perform RMW operation in one clock period.

It is another object of the present invention to provide a circuitry, which can be tuned for starting the write operation depending on the time taken by the controller to modify and correct the read-out data.

To achieve the above objects the invention provides an improved synchronous SRAM capable of faster read-modify-write operation using separate input and output terminals comprising:

a storage cell section;

a sense amplifier section connected to the output from said storage cell section;

an output buffer section having an input connected to said sense amplifier section, an output of said output buffer section being connected to the external read data bus;

an input buffer section having an output connected to said storage cell section, an input of said input buffer section being connected to the external write data bus; and a first mechanism for triggering the write operation simultaneously with the disconnection of said storage cell section from said sense amplifier section.

The said first mechanism is a signal that turns on said sense amplifier section.

It includes a second mechanism for providing a predefined delay between the trigger signal and the commencement of said write operation.

It includes a second mechanism for selectively enabling/disabling said write operation for desired bits/bytes.

It includes a read-modify-write control sequence termination mechanism that operates independently of the write enable function.

The said second mechanism includes a series of delay elements.

The said termination mechanism includes a dedicated enable signal for write operation.

A method for performing a RMW operation in a synchronous SRAM having separate input and output terminals comprising the steps of:

storing the data in storage cell section;

sensing the data in the sense amplifier section; and triggering the write operation simultaneously with the enabling of said sense amplifier with the disconnection of said storage cells from said sense amplifier.

It provides a replicating IO column for defining the termination of read as well as read-modify-write cycle.

It includes a common enabling signal for read and said write operation in said RMW cycle.

Before undertaking the DETAILED DESCRIPTION OF THE INVENTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "apparatus" and "controller" may be used interchangeably and mean any device, system or part thereof that controls at least one operation, such a device may be implemented in hardware, firmware or software, or some combination of at least two of the same. It should be noted that the functionality associated with any particular apparatus or controller may be centralized or distributed. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The implementation of the invention becomes readily apparent with reference to the following detailed description considered in conjunction with the accompanying drawings, in which like reference numerals represent like parts, and in which:

FIG. 6 is a timing chart of a RMW cycle showing the signal sequence of FIG. 4 according to this embodiment.

DETAILED DESCRIPTION OF THE INVENTION

FIGS. 2 through 6, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged synchronous SRAM capable of faster read-modify-write operations.

Figure 1:
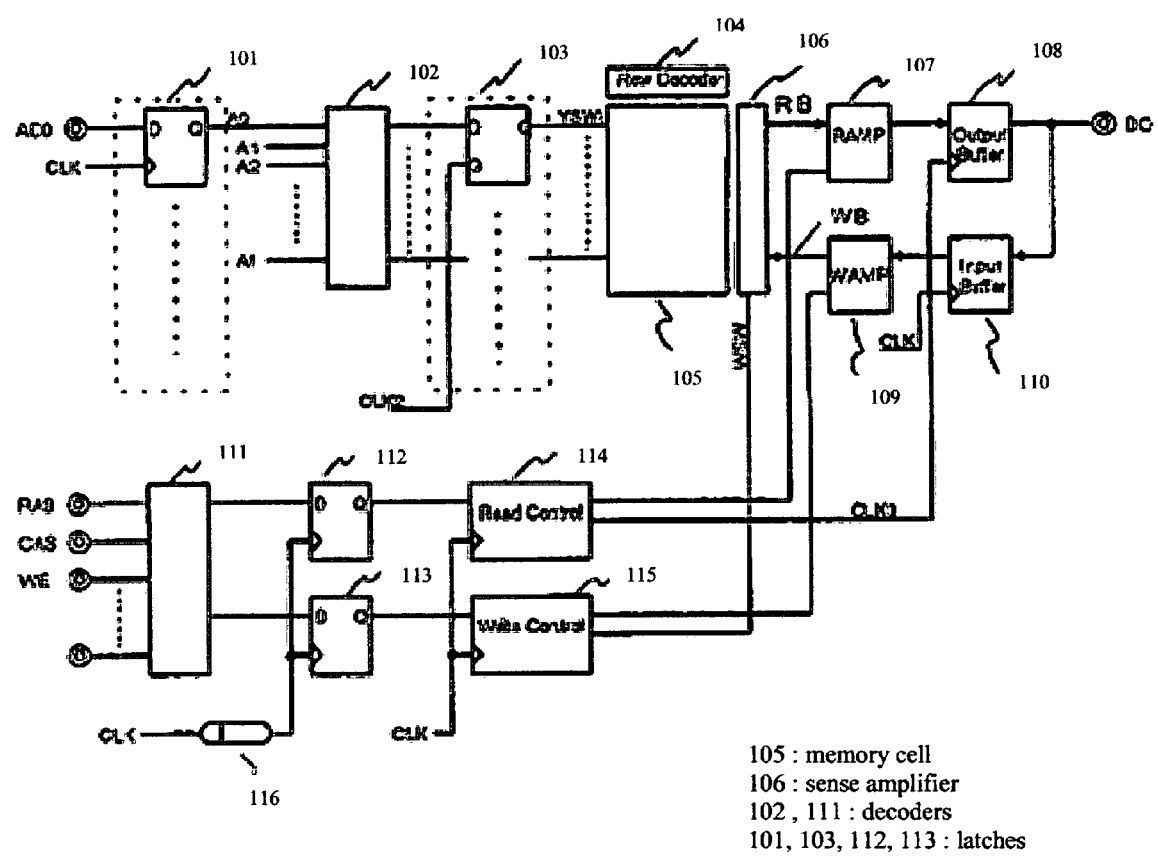
FIG. 1 illustrates a RMW Memory according to prior art.
Figure 2:
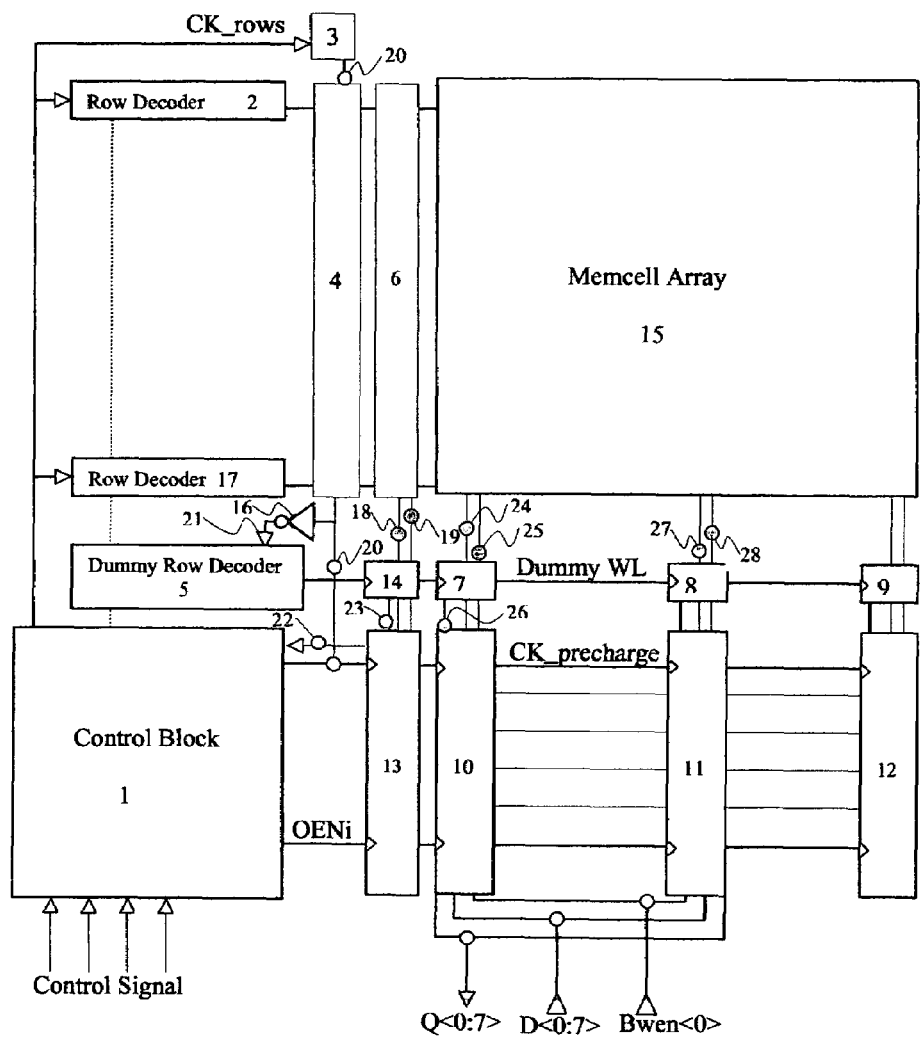
FIG. 2 illustrates a block diagram of a high-speed RMW operation in a SRAM according to the present invention.

FIG. 2 is a block diagram illustrative of a high-speed RMW SRAM according to the present invention. It is intended for use in Cache Memory. It consists of a Control Block 1 which generates clock signals for row decoder selection, precharge clock CK_precharge, output enable signal OENi, row decoder 2 for wordline selection; dummy discharge memory cell 3 to get the desired swing on dummy bitline, dummy column 4 to load the dummy bitline with the same load as in the actual bitline; dummy row decoder 5 similar to row decoder 2 for generating dummy wordline, replica column 6, memory cell array 15, dummy memory cells 7, 8, 9 correspond to their respective IO columns 10, 11, 12; replica IO block 13 which is similar to IO block, dummy memcell 14 corresponding to replica IO, inverter 16 to invert dummy bitline and generate CK_dummyrow which acts as clock for dummy row decoder.

The Self-Timing technique implemented is also shown in the same figure. The clock signal CK_rows enables the row decoder 2 for wordline selection. It also simultaneously activates dummy-discharge memcell 3 which is programmed to "0" so as to discharge dummy-bitline. Dummy-discharge memcell 3 has more than one such memcell tuned on the basis of requirement of sense amplifier to enable it to reflect the desired bitline difference that appears on bitlines from the memcell array 15. The dummy-bitline is a full swing signal and it triggers dummy row decoder 5 which-in-turn generates dummy wordline. The dummy wordline activates row of dummy memcell, which is programmed to permanently store "0" so that their bitlines (bl_senclk) discharge when dummy wordline is selected. Every IO block has its own bl_senclk signal generated by dummy memcell.

Bwen is a byte-write enable pin. For read cycle, all the bwen<0:X> signals should be inactive (high). In RMW cycle, if bwen<0> is low & bwen<1:X> are high, then in the memcell corresponding to D<0:7> new data will be written whereas in rest of the memcells there will be no change in data. Similarly, bwen<1> is associated with D<8:15>, bwen<2> is associated with D<16:23> and so on.

Figure 3:
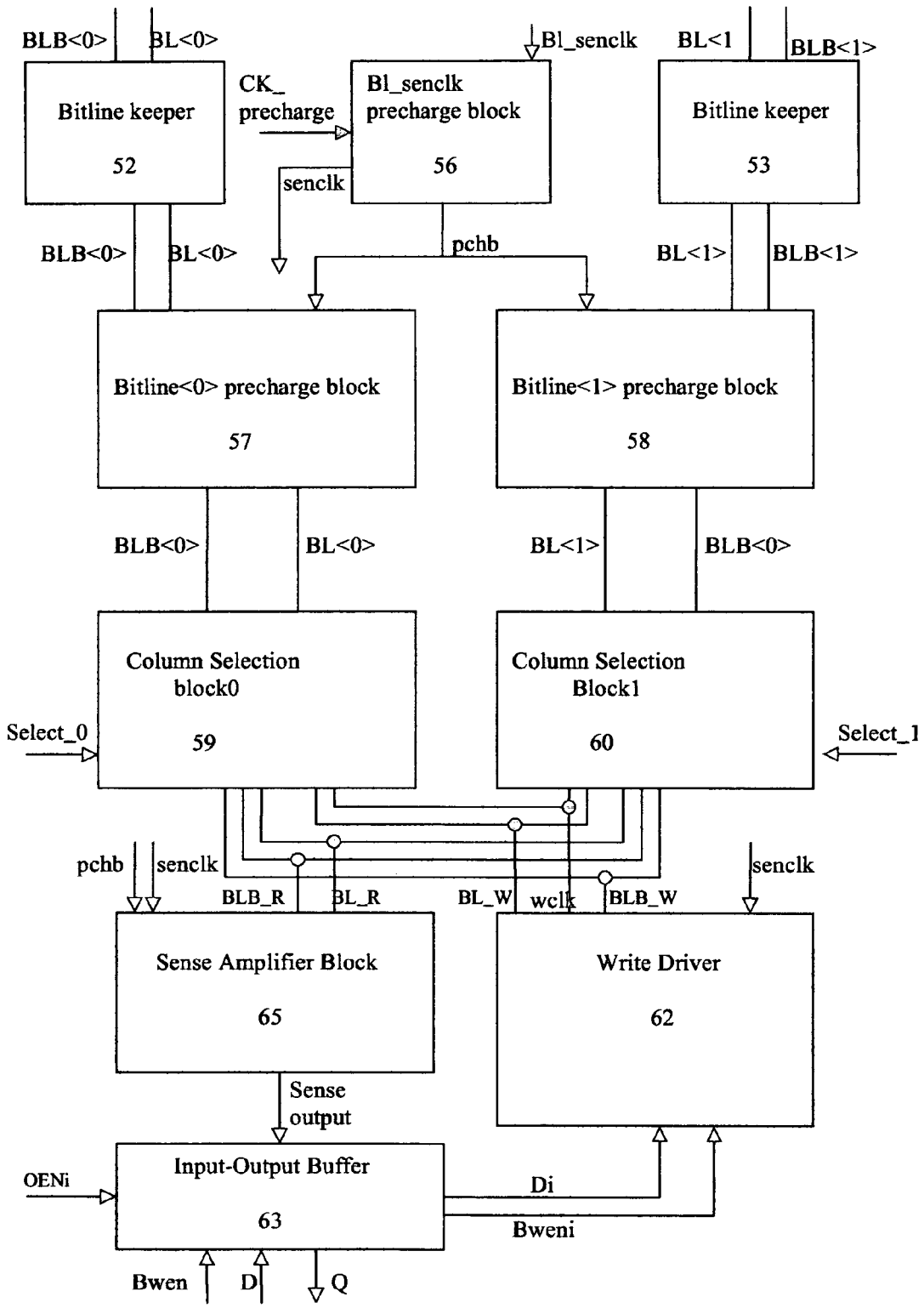
FIG. 3 illustrates, in block diagram, the structure of Input-Output block of FIG. 2.
Figure 4:
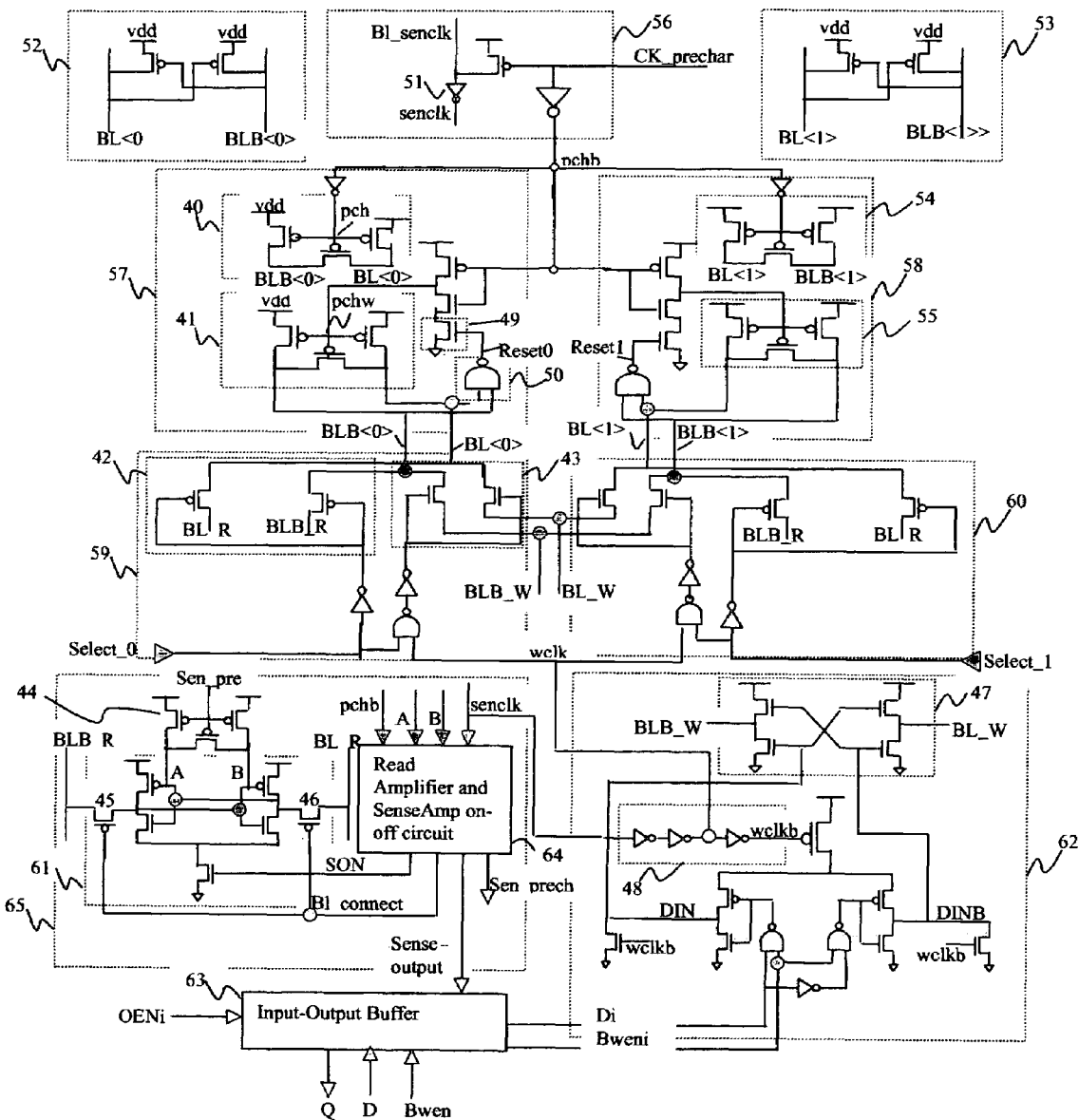
FIG. 4 illustrates, in schematic form, the structure of Input-Output block of FIG. 2.
Figure 5:
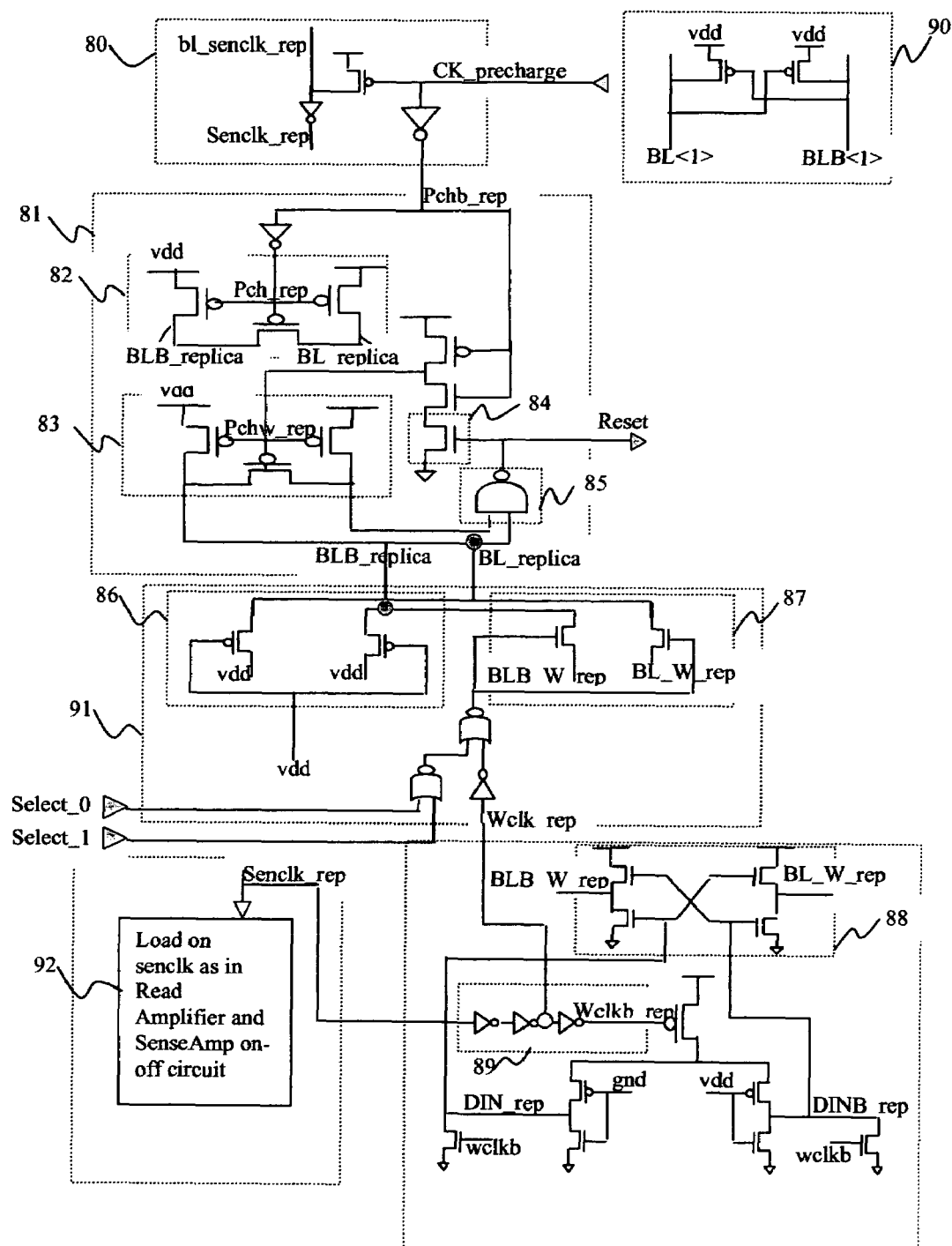
FIG. 5 is a schematic diagram of Replica Input-Output block of FIG. 2.

FIG. 3 and FIG. 4 illustrate the circuitry of IO block in detail while FIG. 5 defines the circuitry of replica IO block. The precharge clock CK_precharge is applied to all precharge circuits namely the memcell present in dummy row, the bitlines of memcell array, the bitline of dummy memcell corresponding to replica IO block, the precharge transistors 44 of sense amplifier 61 and the pass devices 82 and 83. The precharge clock CK_precharge performs the following functions:

a. It precharges bl_senclk, which is the bitline of memcell present in dummy row.

b. It precharges the bitlines of memcell array and controls the pass devices 40, 41, 54 and 55 (FIG. 4) causing them to conduct when it is active (low). Pass device 40 couples lines bl<0> and blb<0> to vdd when it conducts. At the same time, bl<1> and blb<1> are also precharged to VDD by pass device 54. In RMW cycle, the pass devices 41 or 55 conduct depending on whether select0 or select1 signal is enabled.

c. The CK_precharge precharges the signal bl_senclk_replica, which is the bitline of dummy memcell corresponding to replica IO block.

d. The precharge transistor 44 of the sense amplifier 61 (FIG. 4) is turned off in the beginning of the cycle by sen_prech signal, which is derived from the pchb signal.

e. CK_precharge also controls pass devices 82 and 83 (FIG. 5) causing them to conduct when CK_precharge is active. Bl_replica & blb_replica are precharged to VDD by the pass devices 82 and 83.

Senclk signal is the inversion of bl_senclk generated by the inverter 51 of FIG. 4. The rise of senclk signal due to Self-timing switches the sense amplifier 61 "on" and triggers write driver by making wclkb fall. Also the bitlines (BL_R, BLB_R) connected to sense amplifier 61 get decoupled from it with the rise of senclk. Since the bitlines BL_R and BLB_R are no more connected to the differential nodes A and B of the sense amplifier 61, they are free to be written by the write driver 62.

Referring to FIG. 4, in the beginning of the cycle, wclkb signal is inactive (high) so the nodes DIN & DINB are at zero volts (i.e. gnd). The state of bwen signal determines whether the cycle is read or RMW. For the cycle to be RMW, bweni signal, which is buffered bwen signal, is active (high). When the wclkb signal falls to zero volts (gnd), DIN or DINB rises to "vdd" depending on the polarity of Di signal, which is buffered input data D. The rise of DIN or DINB makes BLB_W or BL_W fall respectively.

The rise of wclk signal due to rise of senclk signal 48, makes the pass devices 43 within the column selection block0, 59 turn "on" connecting BL<0> and BLB<0> to nodes BL_W and BLB_W. When BLB_W is pulled by write driver block 62 from "vdd-vt" to "zero" volts, it discharges BLB<0> towards zero volts. On the other hand, because BL_W is at "vdd-vt", it hardly affects BL<0>. The BL<0> and BLB<0> are the bitlines connected to a column of memcell array 15 of FIG. 2. Therefore, "1" is written on the selected row. Similarly "0" is written if BL<0> is pulled to zero volts by the write driver block 62. The pull down of bitlines BL<0> or BLB<0> leads to the rise of reset0 signal due to nand gate 50. Since wclk signal rises in read cycle as well as RMW cycle, therefore pass transistors 42 and 43 will be enabled in both cycles if select0 signal is active (high) whereas select1 is inactive (low) and thus circuit 60 is disabled. The selection will be vice-versa if select1 is active instead of select0.

For write operation in RMW cycle, the input data and bwen is supplied at the setup timing of the external clock CK. The data and bwen signal is latched in the input-output buffer 63 prior to the fall of WCLKB signal.

The rise of reset0 signal indicates that the write operation in the memory cell is completed and the resetting of all the intermediate signals of the memory device can be done for the next cycle. The triggering of resetting operation by reset0 signal has a design specification constraint. Reset0 signal will rise only when RMW operation is done in the first byte always in every cycle. Such limitation in a memory module is never acceptable. To overcome this constraint, a replica input-output (IO) block 13 is placed adjacent to the first input-output block 10, next to the control block 1. The purpose of this replica IO block is to track the delay from senclk signal to reset0 signal generation. Hence the circuit of replica IO block is same as the IO block. The sense amplifier, read amplifier, sense on-off circuit and input-output buffer are not needed in replica IO because there is no need to read the memcell of replica column. Neither data nor bwen signal is needed as input. In every cycle RMW operation happens in replica column so that reset signal rises due to the pull down of BLB_replica by BLB_W_rep. This reset signal resets all the intermediate signals of the memory device. It makes the CK_precharge signal active (low) and thus precharges all the bitlines of memcell array 15, replica memcell column 6 and dummy row 7, 8, 9 before the termination of the cycle.

Upon input of senclk signal to sense on-off circuit 64, SON signal is generated which makes the Latch-type sense amplifier 61 "on". The sense amplifier 61 can detect very low bitline difference and thus aids in attaining high speed. In order to have correct detection by the sense amplifier 61, sense-on (SON) signal switches "on" when the required bitline difference is obtained. The rise of sense-on signal is governed by selftiming technique. The read out data (A and B signals) from sense amplifier 61, which can be recognized by a CMOS logic gate is transmitted to the read amplifier and is further supplied as sense output signal to the Input/Output buffer 63. After sense output is obtained, data output is read out at the set-up timing of output enable signal (OENi) and the read output is obtained at the Q-bus.

The read data RD, is received by a controller like graphics controller, CPU, etc for modification and correction to carry out a subsequent write operation. Depending on the duration taken by the controller to finish its operation, the invertor chain 48 is tuned.

The manner of enabling the sense amplifier 61 and the write driver block 62 by the same senclk signal differs from the prior RMW operation as in the former case the operation is not controlled by a separate read and write enable clock.

FIG. 6 shows that the memory device according to the present embodiment can operate reading and writing simultaneously as having the input data bus D and output data bus Q independently.

This memory device, designed for nanometer technology, operates at 300 MHz frequency, or in 3.33 nsec clock cycle.

Although in the above embodiment, bwen is byte write enable signal, it can be altered to bit write enable or as per the requirement. Similarly Input-Output Block 10, 11, 12 and so on, can be altered to satisfy for other muxes. In that case, apart from select0 and select1 FIG. 3, further select signals will connect the bitlines of sense amplifier 65 (FIG. 4) and write driver 62 (FIG. 4) to that of memcell array 15 of (FIG. 2). It is intended that the present invention encompass such changes and modifications as fall within the scope of the appended claims.

What is claimed is:

1. A synchronous SRAM capable of faster read-modify-write operation using separate input and output terminals comprising:
    a storage cell section;
    a sense amplifier section connected to the output from said storage cell section;
    an output buffer section having an input connected to said sense amplifier section, an output of said output buffer section being connected to the external read data bus;
    an input buffer section having an output connected to said storage cell section, an input of said input buffer section being connected to the external write data bus;
    a first mechanism for triggering the write operation simultaneously with the disconnection of said storage cell section from said sense amplifier section; and
    a second mechanism for providing a predefined delay between the trigger signal and the commencement of said write operation.

2. The synchronous SRAM of claim 1 wherein said second mechanism includes a series of delay elements.

3. A synchronous SRAM capable of faster read-modify-write operation using separate input and output terminals comprising:
    a storage cell section;
    a sense amplifier section connected to the output from said storage cell section; an output buffer section having an input connected to said sense amplifier section, an output of said output buffer section being connected to the external read data bus;
    an input buffer section having an output connected to said storage cell section, an input of said input buffer section being connected to the external write data bus;
    a first mechanism for triggering the write operation simultaneously with the disconnection of said storage cell section from said sense amplifier section; and
    a read-modify-write control sequence termination mechanism that operates independently of the write enable function.

4. The synchronous SRAM of claim 3 wherein said termination mechanism includes a dedicated enable signal for write operation.

5. A method for use with a synchronous SRAM having separate input and output terminals, said method comprising the steps of:
    storing the data in storage cell section;
    sensing the data in the sense amplifier section;

triggering the write operation simultaneously with the enabling of said sense amplifier with the disconnection of said storage cell from said sense amplifier; and providing a replicating IO column for defining the termination of the read as well as read-modify-write cycle.

6. A method for use with a synchronous SRAM having separate input and output terminals, said method comprising the steps of:

storing the data in storage cell section;

sensing the data in the sense amplifier section; and triggering the write operation simultaneously with the enabling of said sense amplifier with the disconnection of said storage cell from said sense amplifier, wherein the synchronous SRAM includes a read-modify-write control sequence termination mechanism that operates independently of the write enable function.

7. A method for use with a synchronous SRAM having separate input and output terminals, said method comprising the steps of:

storing the data in storage cell section;

sensing the data in the sense amplifier section; and triggering the write operation simultaneously with the enabling of said sense amplifier with the disconnection of said storage cell from said sense amplifier, wherein the synchronous SRAM includes a series of delay elements.

8. A synchronous SRAM, comprising:

a storage cell section;

a sense amplifier section connected to the output from said storage cell section;

a first mechanism connected to enable a write operation and to disconnect the storage cell section from the sense amplifier section; and a mechanism for providing a predefined delay between the trigger signal and the commencement of said write operation.

* * * * *

UNITED STATES PATENT AND TRADEMARK OFFICE
CERTIFICATE OF CORRECTION

PATENT NO. : 7,483,289 B2
APPLICATION NO. : 11/195337
DATED : January 27, 2009
INVENTOR(S) : Seema Jain It is certified that error appears in the above-identified patent and that said Letters Patent is hereby corrected as shown below:

Column 6, Claim 1, line 29, delete "the" and replace with -- an --;
Column 6, Claim 1, line 32, delete "the" and replace with -- an --;
Column 6, Claim 1, line 34, delete "the" and replace with -- a --;
Column 6, Claim 1, line 38, delete "said" and replace with -- a --;
Column 6, Claim 3, line 48, delete "the" and replace with -- an --;
Column 6, Claim 3, line 52, delete "the" and replace with -- an --;
Column 6, Claim 3, line 53, delete "the" and replace with -- a --;
Column 6, Claim 3, line 54, delete "the" and replace with -- a --;
Column 6, Claim 3, line 57, delete "the" and replace with -- a --;
Column 6, Claim 5, line 65, insert -- a -- before the term "storage";
Column 6, Claim 5, line 66, delete "the" and replace with -- a --;
Column 7, Claim 5, line 1, delete "the" and replace with -- a --;
Column 7, Claim 5, line 2, insert -- section -- after the term "amplifier" and delete "the" and replace with -- a --;
Column 7, Claim 5, line 3, insert -- section -- after the term "amplifier";
Column 7, Claim 5, line 5, delete "the" and replace with -- a --;
Column 7, Claim 6, line 9, insert -- a -- before the term "storage";
Column 7, Claim 6, line 10, delete "the" and replace with -- a --;
Column 7, Claim 6, line 11, delete "the" (first occurrence) and replace with -- a --;
Column 7, Claim 6, line 11, delete "the" (second occurrence) and replace with -- an --;
Column 7, Claim 6, line 12, delete "the" and replace with -- a --;
Column 7, Claim 6, line 13, insert -- section -- after the term "cell" and insert -- section -- after the term "amplifier";
Column 7, Claim 6, line 16, delete "the" and replace with -- a --;
Column 8, Claim 7, line 1, insert -- a -- before the term "storage";
Column 8, Claim 7, line 2, delete "the" and replace with -- a --;
Column 8, Claim 7, line 3, delete "the" (first occurrence) and replace with -- a --;
Column 8, Claim 7, line 3, delete "the" (second occurrence) and replace with -- an --;
Column 8, Claim 7, line 4, insert -- section -- after the term "amplifier";
Column 8, Claim 7, line 5, insert -- section -- after the term "amplifier";
Column 8, Claim 8, line 10, delete "the" and replace with -- an --; and Signed and Sealed this Twenty-sixth Day of October, 2010

David J. Kappos
*Director of the United States Patent and Trademark Office*

Column 8, Claim 8, line 15, delete "the" and replace with -- a --.